United States Patent [19]

Yamamichi et al.

[11] Patent Number: 5,539,613
[45] Date of Patent: Jul. 23, 1996

[54] COMPACT SEMICONDUCTOR DEVICE INCLUDING A THIN FILM CAPACITOR OF HIGH RELIABILITY

[75] Inventors: Shintaro Yamamichi; Toshiyuki Sakuma; Yoichi Miyasaka, all of Tokyo, Japan

[73] Assignee: NEC Corporation, Tokyo, Japan

[21] Appl. No.: 73,066

[22] Filed: Jun. 8, 1993

[30] Foreign Application Priority Data

Jun. 8, 1992 [JP] Japan ..................... 4-147020

[51] Int. Cl.⁶ ............................ H01G 4/33
[52] U.S. Cl. .................... 361/312; 361/321.1; 361/329; 361/330; 257/532
[58] Field of Search .................... 361/303, 304, 361/305, 311, 312, 313, 321.1, 321.5, 322, 328, 329, 330; 257/295, 305, 306, 310, 311, 532, 534, 535; 365/145; 437/919

[56] References Cited

U.S. PATENT DOCUMENTS

| | | | |
|---|---|---|---|
| 5,046,043 | 9/1991 | Miller et al. | 365/145 |
| 5,198,384 | 3/1993 | Dennison | 437/47 |
| 5,206,788 | 4/1993 | Larson et al. | 361/313 |
| 5,212,620 | 5/1993 | Evans, Jr. et al. | 361/313 |
| 5,227,855 | 7/1993 | Momose | 365/145 |
| 5,303,182 | 4/1994 | Nakao et al. | 365/145 |
| 5,335,138 | 8/1994 | Sandhu et al. | 361/303 |

FOREIGN PATENT DOCUMENTS

| | | | |
|---|---|---|---|
| 0415751 | 10/1991 | European Pat. Off. | 257/295 |
| 2-183569 | 7/1990 | Japan | 257/295 |
| 4-14862 | 1/1992 | Japan . | |

OTHER PUBLICATIONS

"3–Dimensional Stacked Capacitor Cell For 16M and 64M DRAMS" by EMA et al., MOS Division, Fujitsu Limited, Kawasaki, Japan, 1988 IEEE, pp. 592–595.

IEDM, Dec. 1991, pp. 32.1.1–32.1.4, "A stacked capacitor with $(Ba_xSr_{1-x})TiO_3$ for 256M DRAM" by Koyama et al.

*Primary Examiner*—Teresa J. Walberg
*Assistant Examiner*—Gregory L. Mills
*Attorney, Agent, or Firm*—Sughrue, Mion, Zinn, Macpeak & Seas

[57] ABSTRACT

In a semiconductor device which has a substrate, at least one thin film capacitor having a lower electrode layer deposited on the substrate, a dielectric layer overlaid on the lower electrode layer, and an upper electrode layer stacked on the dielectric layer, the lower electrode layer is surrounded by an insulator layer of $Si_3N_4$.

13 Claims, 4 Drawing Sheets

COMPACT SEMICONDUCTOR DEVICE INCLUDING A THIN FILM CAPACITOR OF HIGH RELIABILITY

BACKGROUND OF THE INVENTION

The present invention relates to a semiconductor device which includes a thin film capacitor used in an integrated circuit (IC) or a large scale integration (LSI) circuit.

A conventional semiconductor device of the type described comprises a substrate, a thin film capacitor on the substrate. The thin film capacitor has a lower electrode layer deposited on the substrate, a dielectric layer stacked on the lower electrode layer, and an upper electrode layer overlaid on the dielectric layer. The lower electrode layer and the upper electrode layer are made of a conductive material, such as polycrystalline silicon, or the like. The dielectric layer is conventionally made of $SiO_2$ or $Si_3N_4$ and recently made of $(Ba,Sr)TiO_3$, $Pb(Zr,Ti)O_3$, $Pb(Mg,Nb)O_3$, $Pb(Mg,W)O_3$, or the like.

A plurality of the thin film capacitors may be arranged on the substrate in the above-mentioned manner, and in this event, each of the thin film capacitors may be identical in structure with one another.

In the conventional semiconductor device, when the dielectric layer of the thin film capacitor is made of the aforesaid $(Ba,Sr)TiO_3$, or the like, the lower electrode layer is often formed by double layers one of which is made of Pt and another one of which is made of Ta or Ti. The lower electrode is thereafter shaped into a predetermined configuration with a side surface exposed to an atmosphere.

However, the lower electrode layer which includes the aforesaid Ta layer is quickly oxidized from its side surface, while the dielectric layer of $(Ba,Sr)TiO_3$ or so is being overlaid on the lower electrode layer. The same problem is caused to occur when such a lower electrode layer is subjected to a heat-treatment in an oxygen atmosphere. The oxidization of the lower electrode layer objectionally increases a resistance value of the lower electrode layer. This brings about a serious problem in the case where the thin film capacitor has a small area.

Herein, it is assumed that a semiconductor device comprises a plurality of the thin film capacitors. In this event, the dielectric layer of $(Ba,Sr)TiO_3$ or so is not only formed on the lower electrode shaped into a predetermined form but also is extended to an area between two adjacent ones of the thin film capacitors. As a distance between two adjacent ones of the thin film capacitors becomes short, a coupling capacity therebetween is increased. An increase of the coupling capacity often gives rise to a wrong operation of the IC or LSI which comprises a plurality of the thin film capacitors.

SUMMARY OF THE INVENTION

It is therefore an object of this invention to provide a semiconductor device which can avoid an increase of a resistance in a lower electrode layer included in a thin film capacitor.

It is another object of this invention to provide a semiconductor device of the type described, which can prevent a wrong operation of the IC or LSI, even when a plurality of thin film capacitors are arranged in parallel on a substrate.

Other objects of this invention will become clear as the description proceeds.

According to an aspect of this invention, the semiconductor device comprises a substrate which has a principal surface, a thin film capacitor which is formed on the principal surface and which has a lower electrode layer deposited on the principal surface, a dielectric layer overlaid on the lower electrode layer, and an upper electrode layer stacked on the dielectric layer, and an insulator layer of $Si_3N_4$ which surrounds at least the lower electrode layer.

According to another aspect of this invention, the semiconductor device comprises a substrate which has a principal surface, a plurality of thin film capacitors which are formed on the principal surface and each of which has a lower electrode layer deposited on the principal surface, a dielectric layer of a predetermined dielectric constant overlaid on the lower electrode layer, and an upper electrode layer stacked on the dielectric layer, and an insulator layer which surrounds at least the dielectric layer and which has a dielectric constant lower than the predetermined dielectric constant.

The insulator layer may be made of $SiO_2$ or $Si_3N_4$.

DESCRIPTION OF THE PREFERRED EMBODIMENT

Figure 1:
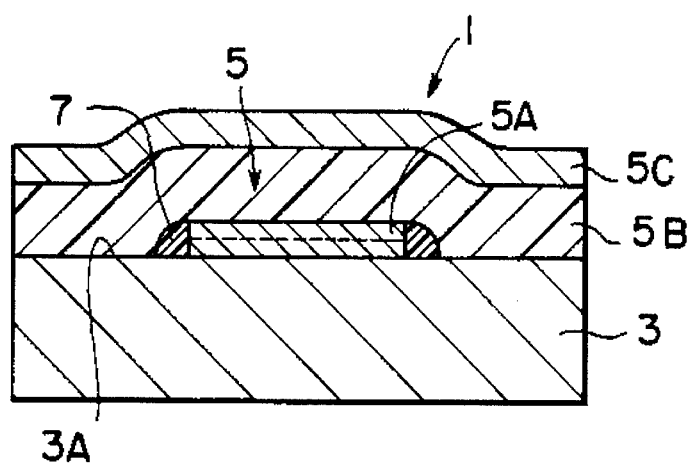
FIG. 1 is a schematic vertical sectional view of a semiconductor device according to a first embodiment of this invention.

Referring to FIG. 1, a semiconductor device 1 comprises a substrate 3, a thin film capacitor 5, and an insulator layer 7. The substrate 3 has a principal surface 3A which is directed upwards of FIG. 1. The thin film capacitor 5 is formed on the principal surface 3A and has a lower electrode layer 5A deposited on the principal surface 3A, a dielectric layer 5B overlaid on the lower electrode layer 5A, and an upper electrode layer 5C stacked on the dielectric layer 5B. The lower electrode layer 5A is shaped into a predetermined configuration and has consequently a side surface exposed to an atmosphere, as illustrated in FIG. 1. The insulator layer 7 is made of $Si_3N_4$ and surrounds the lower electrode layer 5A to cover the side surface of the lower electrode layer 5A.

The substrate 3 has the principal surface of (100) formed by cleaving along a (100) crystal surface. The lower electrode layer 5A is formed by double layers one of which is made of Pt and another of which is made of Ta. The two layers are represented by a dashed line in FIG. 1. The Pt and the Ta layers are as thick as 50 nm respectively. The dielectric layer 5B is formed by (Ba,Sr)TiO$_3$ which is as thick as 100 nm. The upper electrode layer 5C is formed by TiN or 50 nm thick.

In order to manufacture the semiconductor device 1, the substrate 3 is at first prepared in a known manner.

Next, a lower electrode lamina of Pt/Ta is deposited on the principal surface 3A by DC magnetron sputtering on conditions that the temperature of the substrate 3 is kept at room temperature. The lower electrode lamina is then shaped into the predetermined configuration by low pressure ECR etching to form the lower electrode layer 5A and to expose areas of the substrate 3 and the side surface of the lower electrode layer 5A. The lower pressure ECR etching is carried out by the use of HBr.

Third, an insulator lamina of Si$_3$N$_4$ is deposited on the principal surface 3A and is overlaid on the lower electrode layer 5A by a plasma CVD method which uses SiH$_4$ and NH$_3$. The insulator lamina of Si$_3$N$_4$ is then etched by etching to be selectively left as the insulator layer 7 which surrounds the lower electrode layer 5A.

Thereafter, the dielectric layer 5B of (Ba,Sr)TiO$_3$ is overlaid on the lower electrode layer 5A, the insulator layer 7, and the exposed areas of the substrate 3 by ion beam sputtering on conditions that the temperature of the substrate 3 is kept at 400° C. and that the beam voltage of 1000 V is applied to cause the beam current of 40 mA to flow.

Further, the upper electrode layer 5C of TiN is stacked on the dielectric layer 5B by reactive DC sputtering with sputter gas of N$_2$ filled within a space of a DC sputtering apparatus.

In order to investigate a merit of this invention, a comparative example has been manufactured. The example comprises an insulator layer which substantially consists of SiO$_2$ with the remaining parts kept unchanged from FIG. 1. According to the inventions' experimental studies, it has been confirmed that the lower electrode layer is oxidized from its side surface, while the insulator layer of SiO$_2$ is deposited on the principal surface or the dielectric layer of (Ba,Sr)TiO$_3$ is overlaid on the lower electrode layer. The oxidization of the lower electrode layer objectionally increase a resistance value of the lower electrode layer. This brings about problems that a capacity of the example decreases in a region of a high frequency not less than 1 MHz or that the lower electrode layer can not have a designed area.

On the contrary, it has also been confirmed that the semiconductor device 1 illustrated in FIG. 1 can avoid an increase of the resistance value in the lower electrode layer 5A. The semiconductor device 1 has an excellent high frequency characteristic in which a capacity of the thin film capacitor 5 does not decrease in a region of high frequency up to 1 GHz. The semiconductor device 1 is also excellent in a voltage-current characteristic because a leak current does not exceed $10^{-8}$ A/cm$^2$ even when a voltage of 5 v is applied to the thin film capacitor 5.

Figure 2:
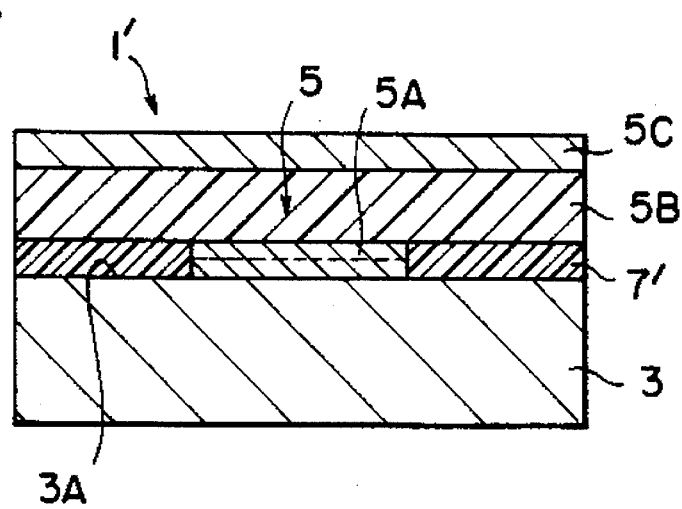
FIG. 2 is a schematic vertical sectional view of a modification of the semiconductor device illustrated in FIG. 1.

Referring now to FIG. 2, description is made about a modification of the semiconductor device 1 illustrated in FIG. 1.

As illustrated in FIG. 2, a semiconductor device 1' is similar in structure to the semiconductor device 1 illustrated in FIG. 1 except that an insulator layer 7' is elongated to both edges of the semiconductor device 1'. Similar portions are designated by like reference numerals.

The semiconductor device 1' can be manufactured in a similar method to that of the semiconductor device 1 except that an insulator lamina of Si$_3$N$_4$ is deposited on the principal surfaces 3A and the lower electrode layer 5A and is then etched only on an upper surface of the lower electrode layer 5A to be exposed to an atmosphere and to form the insulator layer 7'. It has been confirmed that the semiconductor device 1' can achieve high frequency and voltage-current characteristics similar to those of the semiconductor device 1 illustrated in FIG. 1.

Thus, the insulator lamina of Si$_3$N$_4$ does not need to be left only on the area of the principal surface 3A around the side surface of the lower electrode layer 5A. However, the insulator lamina of Si$_3$N$_4$ must be etched until an upper surface of the lower electrode layer 5A is exposed to an atmosphere so that the dielectric layer 5B can be stacked on the upper surface of the lower electrode layer 5A.

Figure 3:
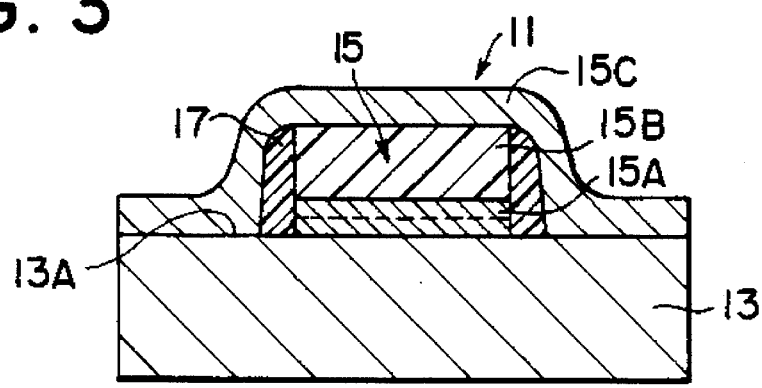
FIG. 3 is a schematic vertical sectional view of a semiconductor device according to a second embodiment of this invention.

Referring to FIG. 3, description will proceed to a semiconductor device according to a second embodiment of this invention.

The semiconductor device according to the second embodiment has similar structure to that of the first embodiment except that the insulator layer 17 surrounds the lower electrode layer 15A and the dielectric layer 15B so that side surfaces of the lower electrode layer 15A and the dielectric layer 15B are covered with the insulator layer 17.

In order to manufacture the semiconductor device 11, the substrate 13 is at first prepared in the manner mentioned in conjunction with FIGS. 1 and 2.

Second, a lower electrode lamina of Pt/Ta is deposited on the principal surface 13A by DC magnetron sputtering on conditions that the temperature of the substrate 13 is kept at room temperature. The dielectric lamina of (Ba,Sr)TiO$_3$ is then overlaid on the lower electrode lamina by ion beam sputtering on conditions that the temperature of the substrate 13 is kept at 400° C. and that the beam voltage of 1000 V is applied to cause the beam current of 40 mA to flow. The dielectric lamina as well as the lower electrode lamina are thereafter shaped into a predetermined configuration by low pressure ECR etching to form both the dielectric layer 15B and the lower electrode layer 15A and to expose areas of the substrate 13. The low pressure ECR etching is carried out by the use of Ar and HBr.

Third, an insulator lamina of Si$_3$N$_4$ is deposited on the principal surface 13A, the lower electrode layer 15A and the dielectric layer 15B by a plasma CVD method which uses SiH$_4$ and NH$_3$. The insulator lamina of Si$_3$N$_4$ is then etched by anisotropy etching to be selectively left as the insulator layer 17 which surrounds the lower electrode layer 15A and the dielectric layer 15B.

Further, the upper electrode layer 15C of TiN is stacked on the dielectric layer 15B by reactive DC sputtering by the use of a sputter gas of N$_2$.

Like the above-mentioned first embodiment, a comparative example has been manufactured which comprises an insulator layer which surrounds the lower electrode layer and the dielectric layer and which substantially consists of SiO$_2$. As a result of comparison of the semiconductor device illustrated in FIG. 3 and the comparative example, it has been confirmed that the lower electrode layer is oxidized from its side surface in the comparative example which includes the insulator layer of SiO$_2$. The oxidization of the lower electrode layer objectionally increases a resistance value of the lower electrode layer. This brings about problems similar to those mentioned in conjunction with FIGS. 1 and 2.

On the contrary, it has also been confirmed that the semiconductor device 11 illustrated in FIG. 3 can also avoid an increase of the resistance value in the lower electrode layer 15A and is excellent in the high frequency characteristic and the voltage-current characteristic, like in FIGS. 1 and 2.

Figure 4:
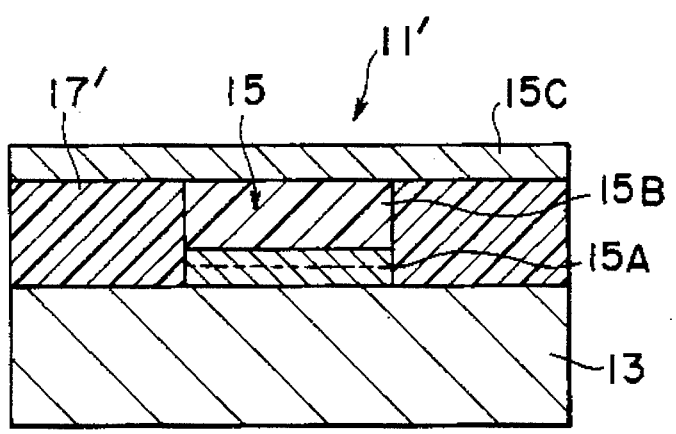
FIG. 4 is a schematic vertical section view of a modification of the semiconductor device illustrated in FIG. 3.

Referring now to FIG. 4, description is made about a modification of the semiconductor device 11 illustrated in FIG. 3.

As illustrated in FIG. 4, a semiconductor device 11' is similar in structure to the semiconductor device 11 illustrated in FIG. 3 except that an insulator layer 17' is elongated to both edges of the semiconductor device 11'. Similar portions are designated by like reference numerals.

The semiconductor device 11' can be manufactured in a similar method to that of the semiconductor device 11 except that an insulator lamina of $Si_3N_4$ is deposited on the principal surface 3A, the lower electrode layer 15A, and the dielectric layer 15B and is then etched on an upper surface of the dielectric layer 15B to be exposed to an atmosphere and to form the insulator layer 17'. It has been confirmed that the semiconductor device 11' can achieve high frequency and voltage-current characteristics similar to those of the semiconductor device 11 illustrated in FIG. 3.

Thus, the insulator lamina of $Si_3N_4$ does not need to be left only on the area of the principal surface 13A around the side surface of the lower electrode layer 15A and the dielectric layer 15B. However, the insulator lamina of $Si_3N_4$ must be etched until an upper surface of the dielectric layer 15B is exposed to an atmosphere so that the upper electrode layer 15C can be stacked on the upper surface of the dielectric layer 15B.

Figure 5:
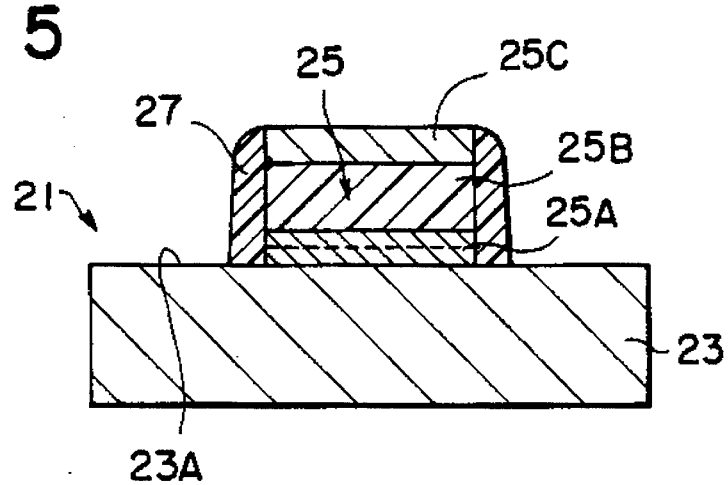
FIG. 5 is a schematic vertical sectional view of a semiconductor device according to a third embodiment of this invention.

Referring to FIG. 5, description will proceed to a semiconductor device according to a third embodiment of this invention.

The semiconductor device according to the third embodiment has similar structure to that of the second embodiment except that the insulator layer 27 surrounds the lower electrode layer 25A, the dielectric layer 25B, and the upper electrode layer 25C so that side surfaces of the lower electrode layer 25A, the dielectric layer 25B, and the upper electrode layer 25C are covered with the insulator layer 27.

In order to manufacture the semiconductor device 21, the substrate 23 is at first prepared in the manner mentioned in conjunction with FIGS. 1 and 2.

Second, a lower electrode lamina of Pt/Ta is deposited on the principal surface 23A by DC magnetron sputtering on conditions that the temperature of the substrate 23 is kept at room temperature. The dielectric lamina of $(Ba,Sr)TiO_3$ is then overlaid on the lower electrode lamina by ion beam sputtering on conditions that the temperature of the substrate 23 is kept at 400° C. and that the beam voltage of 1000 V is applied to cause the beam current of 40 mA to flow. Further, the upper electrode lamina of TiN is stacked on the dielectric lamina by reactive DC sputtering by the use of a sputter gas of $N_2$.

The lower electrode lamina, the dielectric lamina, and the upper electrode lamina are thereafter shaped into a predetermined configuration by low pressure ECR etching to form the lower electrode layer 25A, the dielectric layer 25B, and the upper electrode layer 25C to expose areas of the substrate 23. The low pressure ECR etching is carried out by the use of Ar and HBr.

Third, an insulator lamina of $Si_3N_4$ is deposited on the principal surface 13A, the lower electrode layer 25A, the dielectric layer 25B, and the upper electrode layer 25C by a plasma CVD method which uses $SiH_4$ and $NH_3$.

The insulator lamina of $Si_3N_4$ is then etched by anisotropy etching which uses $CF_4$ to be selectively left as the insulator layer 27 which surrounds the lower electrode layer 25A, the dielectric layer 25B, and the upper electrode layer 25C.

Like the above-mentioned second embodiment, a comparative example has been manufactured. The example comprises an insulator layer which surrounds the lower electrode layer, the dielectric layer, and the upper electrode layer and which substantially consists of $SiO_2$. As a result of comparison of the semiconductor device illustrated in FIG. 5 and the comparative example, it has been confirmed that the lower electrode layer is oxidized from its side surface in the comparative example which includes the insulator layer of $SiO_2$. The oxidization of the lower electrode layer objectionally increases a resistance value of the lower electrode layer. This also brings about problems similar to those mentioned in conjunction with FIGS. 1, 2, and 3.

On the contrary, it has also been confirmed that the semiconductor device 21 illustrated in FIG. 5 can also avoid an increase of the resistance value in the lower electrode layer 25A and is excellent in the high frequency characteristic and the voltage-current characteristic, like in FIGS. 1, 2, and 3.

Figure 6:
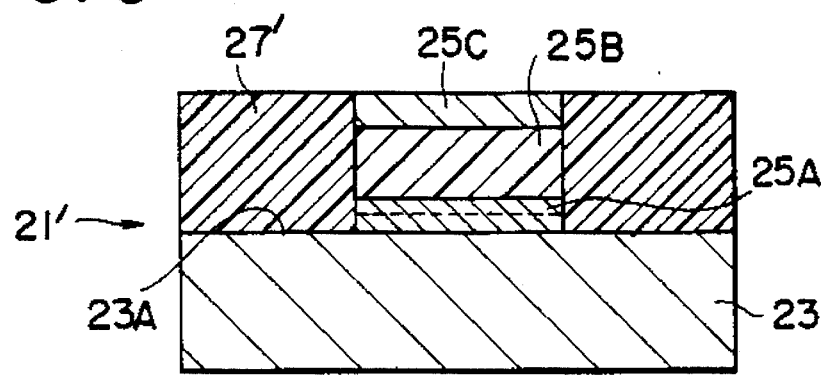
FIG. 6 is a schematic vertical sectional view of a modification of the semiconductor device illustrated in FIG. 5.

Referring now to FIG. 6, description is made about a modification of the semiconductor device 21 illustrated in FIG. 5.

As illustrated in FIG. 6, a semiconductor device 21' is similar in structure to the semiconductor device 21 except that an insulator layer 27' is elongated to both edges of the semiconductor device 21'. Similar portions are designated by like reference numeral.

The semiconductor device 21' can be manufactured in a similar method to that of the semiconductor device 21 illustrated in FIG. 5 except that an insulator lamina of $Si_cN_4$ is deposited on the principal surface 23A, the lower electrode layer 25A, the dielectric layer 25B, and the upper electrode layer 25C and is then etched on an upper surface of the upper electrode layer 25B to be exposed to an atmosphere and to form the insulator layer 27'. It has been configured that the semiconductor device 21' can achieve high frequency and voltage-current characteristics similar to those of the semiconductor device 21 illustrated in FIG. 5.

Thus, the insulator lamina of $Si_3N_4$ does not need to be left only on the area of the principal surface 23A around the side surface of the lower electrode layer 25A, the dielectric layer 25B, and the upper electrode layer 25C. However, the insulator lamina of $Si_3N_4$ must be etched until an upper surface of the upper electrode layer 25C is exposed to an atmosphere.

Figure 7:
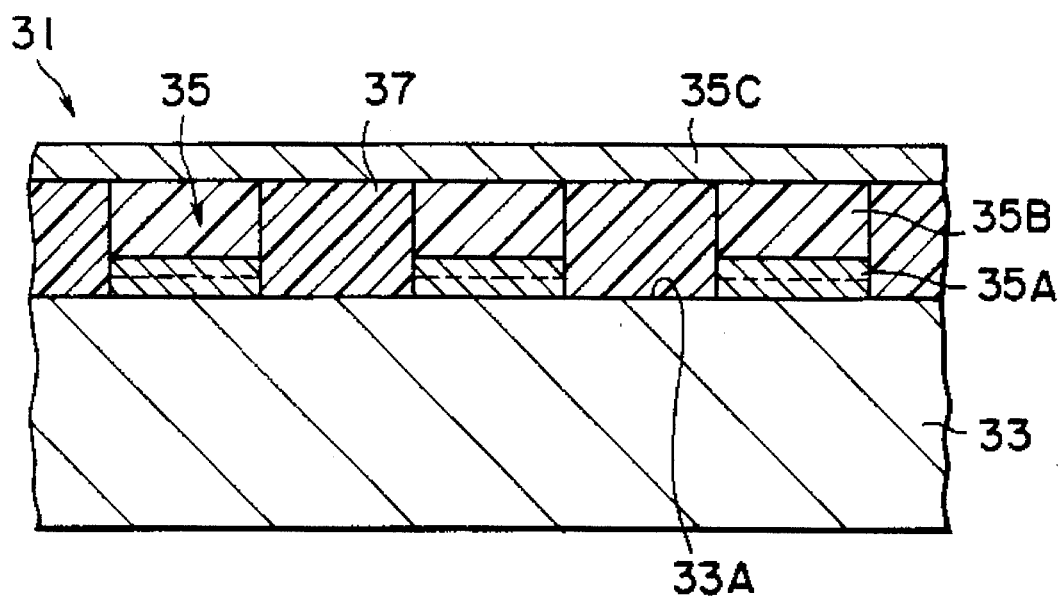
FIG. 7 is a schematic vertical sectional view of a semiconductor device according to a fourth embodiment of this invention.

Referring to FIG. 7, description will proceed to a semiconductor device according to a fourth embodiment of this invention.

As illustrated in FIG. 7, a semiconductor device 31 comprises a substrate 33, a plurality of thin film capacitors 35, and an insulator layer 37. The substrate 33 has a principal surface 33A which is directed upwards of FIG. 1. The plurality of thin film capacitors 35 are formed on the principal surface 33A and each of which as a lower electrode layer 35A deposited on the principal surface 33A, a dielectric layer 35B of a predetermined dielectric constant overlaid on the lower electrode layer 35A, and an upper electrode layer 35C stacked on the dielectric layer 35B. The insulator layer 37 surrounds the lower electrode layer 35A and the dielectric layer 35B.

The substrate 33 is made of silicon cleaved at a (100) crystal surface. The lower electrode layer 35A is formed by double layers one of which is made of Pt and another of which is made of TiN. The Pt and the TiN layers are as thick as 50 nm respectively. The dielectric layer 35B is as thick as 100 nm and is formed by (Ba,Sr)TiO$_3$ of a predetermined dielectric constant. The upper electrode layer 35C is formed by TiN which is as thick as 50 nm. The insulator layer 37 is made of SiO$_2$ which has a dielectric constant lower than the predetermined dielectric constant of (Ba,Sr)TiO$_3$ dielectric layer 35B.

In order to manufacture the semiconductor device 31, the substrate 33 is at first prepared in a known manner.

Second, the lower electrode lamina of Pt/TiN are deposited on the principal surface 33A by DC magnetron sputtering on conditions that the temperature of the substrate 33 is kept at room temperature. In this sputtering, TiN lamina is deposited by reactive DC sputtering with sputter gas which includes N$_2$.

Third, the dielectric lamina of (Ba,Sr)TiO$_3$ is overlaid on the lower electrode lamina by ion beam sputtering on conditions that the temperature of the substrate 33 is kept at 400° C. and that the beam voltage of 1000 V is applied to flow the beam current of 40 mA. The lower electrode lamina and the dielectric lamina are then shaped into a predetermined form by low pressure ECR etching to form the lower electrode layer 35A and the dielectric layer 35B and to make exposed areas of the substrate 33. The low pressure ECR etching is carried out by the use of Ar and HBr.

Thereafter, the insulator lamina of SiO$_2$ is deposited on the principal surface 33A in such a manner as overlaying the lower electrode layer 35A and the dielectric layer 35B by a plasma CVD method which uses SiH$_4$ and N$_2$O. The insulator lamina of SiO$_2$ is then etched by anisotropy etching to be selectively left as the insulator layer 37 which surrounds the lower electrode layer 35A and the dielectric layer 35B.

Further, the upper electrode layer 35C of TiN is stacked on the dielectric layer 35B by reactive DC sputtering with sputter gas which includes N$_2$.

As a result of comparison of the semiconductor device illustrated in FIG. 7 and a conventional one, it has been confirmed that a coupling capacity between two adjacent ones of the thin film capacitors 35 is so far decreased in comparison with an actual capacity of each thin film capacitor 35. Clearly, this is because the thin film capacitors 35 are separated from one another by the insulator layer 37. As a result, the semiconductor device 31 can prevent a wrong operation even though a plurality of the thin film capacitors 35 are arranged in parallel on the substrate 33.

Figure 8:
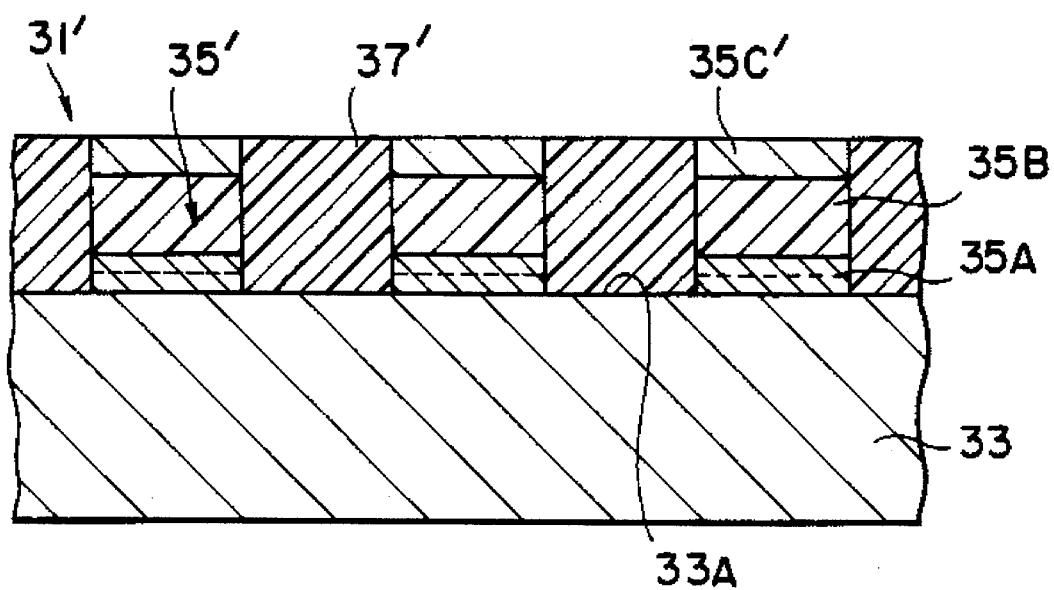
FIG. 8 is a schematic vertical sectional view of one modification of the semiconductor device illustrated in FIG. 7.

Referring now to FIG. 8, description is made about a modification of the semiconductor device 31 illustrated in FIG. 7.

As illustrated in FIG. 8, a semiconductor device 31' is similar in structure to the semiconductor device 31 except that an insulator layer 37' surrounds the upper electrode layer 35C' as well as the lower electrode layer 35A and the dielectric layer 35B. The semiconductor device 31' can be manufactured in a method similar to that of the semiconductor device 31 except that an insulator lamina of SiO$_2$ is deposited on the principal surface 33A, the lower electrode layer 35A, the dielectric layer 35B, and the upper electrode layer 35C and is then etched on an upper surface of the upper electrode layer 35C to be exposed to an atmosphere and to form the insulator layer 37'. It has been confirmed that the semiconductor device 31' can achieve effects similar to those of the semiconductor device 31.

Figure 9:
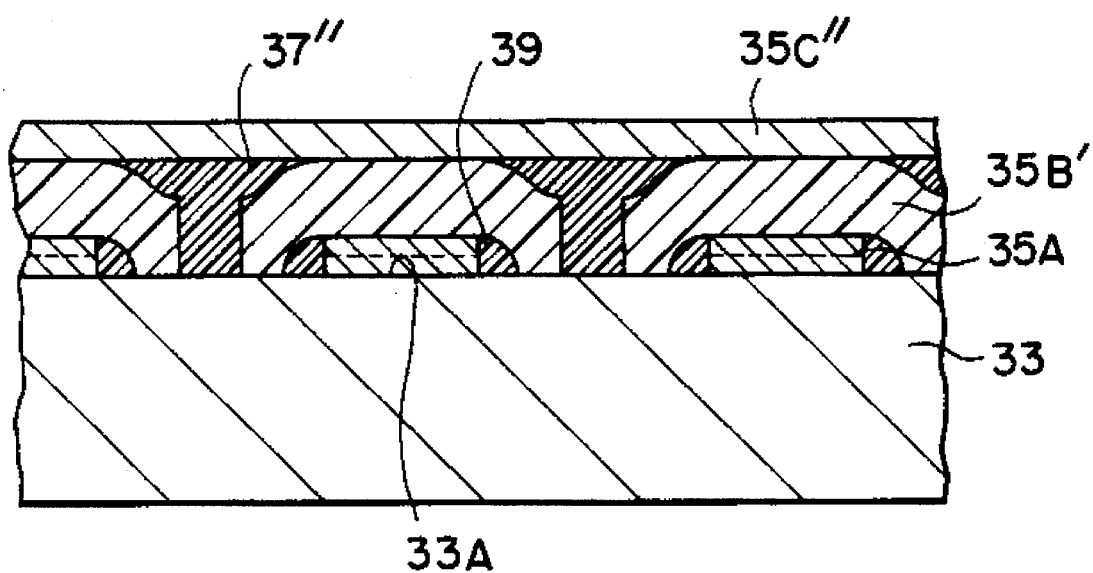
FIG. 9 is a schematic vertical sectional view of another modification of the semiconductor device illustrated in FIG. 7.

Referring to FIG. 9, description is made about another modification of the semiconductor device 31 illustrated in FIG. 7.

As illustrated in FIG. 9, a semiconductor device 31" comprises a substrate 33, a plurality of thin film capacitors 35", a first insulator layer 39, and a second insulator layer 37". The substrate 33 has a principal surface 33A which is directed upwards of FIG. 9. The plurality of thin film capacitors 35" are formed on the principal surface 33A each of which is similar in structure to the thin film capacitor 5 illustrated in FIG. 1. Namely, each thin film capacitor 35" has a lower electrode layer 35A deposited on the principal surface 33A, a dielectric layer 35B' of a predetermined dielectric constant overlaid on the lower electrode layer 35A, and an upper electrode layer 35C" stacked on the dielectric layer 35B'. The first insulator layer 39 surrounds the lower electrode layer 35A. The second insulator layer 37" surrounds the dielectric layer 35B' to separate the plurality of thin film capacitors 35" from one another.

The substrate 33 is made of silicon cleaved at (100) crystal surface. The lower electrode layer 35A is formed by double layers one of which is made of Pt and another of which is made of TiN. The Pt and the TiN layers are as thick as 50 nm respectively. The dielectric layer 35B' is as thick as 100 nm and is formed by (Ba,Sr)TiO$_3$ of a predetermined dielectric constant. The upper electrode layer 35C" is formed by TiN which is as thick as 50 nm. The first insulator layer 39 is made of SiO$_2$. The second insulator layer 37" is made of SiO$_2$ which has a dielectric constant lower than the predetermined dielectric constant of (Ba,Sr)TiO$_3$ dielectric layer 35B'.

It has been confirmed that the semiconductor device 31" can achieve similar effects to those of the semiconductor device 31 or 31'.

The lower electrode layer 35A may be formed by double layers one of which is made of Pt and another of which is made of Ta. In this event, the first insulator layer 39 should be made of Si$_3$N$_4$ to avoid an increase of a resistance in the lower electrode layer 35A. Further, also the second insulator layer 37" may be made of Si$_3$N$_4$, since a dielectric constant of Si$_3$N$_4$ is lower than that of the predetermined dielectric constant of (Ba,Sr)TiO$_3$ dielectric layer 35B'.

While this invention has thus far been described in conjunction with only several embodiments thereof, it will readily be possible for those skilled in the art to put this invention into practice in various other manners. For example, the dielectric layer may be formed by a material selected from a group consisting of (Ba,Sr)TiO$_3$, SrTiO$_3$, PbTiO$_3$, Pb(Zr,Ti)O$_3$, (Pb,La)(Zr,Ti)O$_3$, Pb(Mg,Nb)O$_3$, Pb(Mg,W)O$_3$, Pb(Zn,Nb)O$_3$, LiTaO$_3$, LiNbO$_3$, KTaO$_3$, Ta$_2$O$_5$, Bi$_4$Ti$_3$O$_{12}$, and BaMgF$_4$. On the other hand, the semiconductor device 31, 31' and 31" may further include other electric or electronic elements such as transistors, resistances, or the like.

What is claimed is:

1. A semiconductor device comprising:

a substrate having a principal surface;

a thin film capacitor which is formed on said principal surface and which has a lower electrode layer deposited on said principal surface, a dielectric layer overlaid on said lower electrode layer, and an upper electrode layer stacked on said dielectric layer; and an insulator layer of Si$_3$N$_4$ formed on at least the principal surface of said substrate and which surround at least said lower electrode layer, said insulator layer preventing a contact resistance of said lower electrode layer from increasing by preventing oxidation of said lower electrode layer, said insulator layer forming a substantially planar surface with a top surface of said lower electrode layer.

2. A semiconductor device as claimed in claim 1, wherein said dielectric layer is formed by a material selected from a group consisting of $(Ba,Sr)TiO_3$, $SrTiO_3$, $PbTiO_3$, $Pb(Zr,Ti)O_3$, $(Pb,La)(Zr,Ti)O_3$, $Pb(Mg,Nb)O_3$, $Pb(Mg,W)O_3$, $Pb(Zn,Nb)O_3$, $LiTaO_3$, $LiNbO_3$, $KTaO_3$, $Ta_2O_5$, $Bi_4Ti_3O_{12}$, and $BaMgF_4$.

3. A semiconductor device comprising:

a substrate having a principal surface;

a plurality of thin film capacitors which are arranged on said principal surface in parallel and each of which has a lower electrode layer deposited on said principal surface, a dielectric layer of a predetermined dielectric constant overlaid on said lower electrode layer, and an upper electrode layer stacked on said dielectric layer; and an insulator layer formed on at least the principal surface of said substrate and which forms a substantially planar surface with a top surface of said dielectric layer of each of said thin film capacitor and which has a dielectric constant lower than said predetermined dielectric constant, wherein said insulator layer causes a coupling capacitance between adjacent capacitors to be small in comparison to a capacitance of said thin film capacitors; and wherein said insulator layer does not extend beyond an upper surface of said upper electrode layer.

4. A semiconductor device as claimed in claim 3, wherein said insulator layer is made of $SiO_2$.

5. A semiconductor device as claimed in claim 3 wherein said insulator layer is made of $Si_3N_4$, and prevents oxidation of said lower electrode layer.

6. A semiconductor device as claimed in claim 3, wherein said dielectric layer is formed by a material selected from a group consisting of $(Ba,Sr)TiO_3$, $SrTiO_3$, $PbTiO_3$, $Pb(Zr,Ti)O_3$, $(Pb,La)(Zr,Ti)O_3$, $Pb(Mg,Nb)O_3$, $Pb(Mg,W)O_3$, $Pb(Zn,Nb)O_3$, $LiTaO_3$, $LiNbO_3$, $KTaO_3$, $Ta_2O_5$, $Bi_4Ti_3O_{12}$, and $BaMgF_4$.

7. A semiconductor device comprising:

a substrate having a principal surface;

a plurality of thin film capacitors which are arranged on said principal surface in parallel and each of which has a lower electrode layer deposited on said principal surface, a dielectric layer of a predetermined dielectric constant overlaid on said lower electrode layer, and an upper electrode layer stacked on said dielectric layer.

a first insulator layer comprising a plurality of discrete portions, each of said discrete portions corresponding to one of said plurality of thin film capacitors, respectively, wherein each of said discrete portions surrounds at least said lower electrode layer of said corresponding one of said plurality of thin film capacitors; and a second insulator layer which surrounds at least said dielectric layer of each of said plurality of thin film capacitors and which has a dielectric constant lower than said predetermined dielectric constant wherein said insulator layer causes a coupling capacitance between adjacent capacitors to be small in comparison to a capacitance of said thin film capacitors.

8. A semiconductor device as claimed in claim 7, wherein said lower electrode layer is composed of double layers one of which is made of Pt and another of which is made of Ta, said first and said second insulator layers being made of $Si_3N_4$, wherein said first insulator layer prevents oxidation of said lower electrode layer.

9. A semiconductor device as claimed in claim 7, wherein said dielectric layer is formed by a material selected from a group consisting of $(Ba,Sr)TiO_3$, $SrTiO_3$, $PbTiO_3$, $Pb(Zr,Ti)O_3$, $(Pb,La)(Zr,Ti)O_3$, $Pb(Mg,Nb)O_3$, $Pb(Mg,W)O_3$, $Pb(Zn,Nb)O_3$, $LiTaO_3$, $LiNbO_3$, $KTaO_3$, $Ta_2O_5$, $Bi_4Ti_3O_{12}$, and $BaMgF_4$.

10. A semiconductor device as claimed in claim 7, wherein said discrete portions are surrounded by said dielectric layer.

11. A semiconductor device comprising:

a substrate having a principal surface;

a thin film capacitor which is formed on said principal surface and which has a lower electrode layer deposited on said principal surface, a dielectric layer overlaid on said lower electrode layer, and an upper electrode layer stacked on said dielectric layer; and an insulator layer of $Si_3N_4$ formed on at least the principal surface of said substrate and which surrounds at least said lower electrode layer, said insulator layer preventing a contact resistance of said lower electrode layer from increasing by preventing oxidation of said lower electrode layer, said insulator layer being surrounded on top and side surfaces by said dielectric layer.

12. A semiconductor device comprising:

a substrate having a principal surface;

a thin film capacitor which is formed on said principal surface and which has a lower electrode layer deposited on said principal surface, a dielectric layer overlaid on said lower electrode layer, and an upper electrode layer stacked on said dielectric layer; and an insulator layer of $Si_3N_4$ formed on at least the principal surface of said substrate and which surrounds at least said lower electrode layer, said insulator layer preventing a contact resistance of said lower electrode layer from increasing by preventing oxidation of said lower electrode layer, said insulator layer forming a substantially planar surface with a top surface of said dielectric layer.

13. A semiconductor device comprising:

a substrate having a principal surface;

a thin film capacitor which is formed on said principal surface and which has a lower electrode layer deposited on said principal surface, a dielectric layer overlaid on said lower electrode layer, and an upper electrode layer stacked on said dielectric layer; and an insulator layer of $Si_3N_4$ formed on at least the principal surface of said substrate and which surrounds at least said lower electrode layer, said insulator layer preventing a contact resistance of said lower electrode layer from increasing by preventing oxidation of said lower electrode layer.

said insulator layer being surrounded on top and side surfaces by said upper electrode layer.

* * * * *

UNITED STATES PATENT AND TRADEMARK OFFICE
CERTIFICATE OF CORRECTION

PATENT NO. : 5,539,613
DATED : July 23, 1996
INVENTOR(S) : Shintaro YAMAMICHI, et al.

It is certified that error appears in the above-indentified patent and that said Letters Patent is hereby corrected as shown below:

Column 6, line 38, delete "$Si_c$" and insert --$Si_3$--.

Column 6, line 44, delete "configured" and insert --confirmed--.

Signed and Sealed this

Twenty-second Day of October, 1996

Attest:

BRUCE LEHMAN

*Attesting Officer*  *Commissioner of Patents and Trademarks*